(12) United States Patent  
Lee

(10) Patent No.: US 9,276,017 B2
(45) Date of Patent: Mar. 1, 2016

(54) DISPLY DEVICE FOR MINIMIZING THICKNESS OF BEZEL AREA

(71) Applicant: LG DISPLAY CO., LTD., Seoul (KR)

(72) Inventor: YoungJang Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/584,603

(22) Filed: Dec. 29, 2014

(65) Prior Publication Data

US 2015/0187810 A1 Jul. 2, 2015

(30) Foreign Application Priority Data

Dec. 30, 2013 (KR) .......................... 10-2013-0167470

(51) Int. Cl.
| | | |
|---|---|---|
| *H01L 27/12* | (2006.01) | |
| *G02F 1/1368* | (2006.01) | |
| *G02F 1/1362* | (2006.01) | |
| *G02F 1/1335* | (2006.01) | |
| *H01L 27/32* | (2006.01) | |
| *G02F 1/167* | (2006.01) | |
| *H01L 51/52* | (2006.01) | |

(52) U.S. Cl.
CPC ............ *H01L 27/124* (2013.01); *G02F 1/1368* (2013.01); *G02F 1/133512* (2013.01); *G02F 1/133514* (2013.01); *G02F 1/136277* (2013.01); *G02F 1/136286* (2013.01); *G02F 1/167* (2013.01); *H01L 27/3276* (2013.01); *H01L 51/524* (2013.01); *G09G 2310/0286* (2013.01)

(58) Field of Classification Search
CPC ..................... G09G 2310/0286; G02F 1/1345; G02F 1/136286; H01L 27/124; H01L 27/3276
See application file for complete search history.

(56) References Cited

U.S. PATENT DOCUMENTS

| | | | |
|---|---|---|---|
| 7,564,529 B2* | 7/2009 | Ahn ............................... | 349/141 |
| 7,903,207 B2* | 3/2011 | Lee et al. ...................... | 349/106 |
| 2008/0002130 A1* | 1/2008 | Kil ................................ | 349/149 |
| 2009/0219457 A1* | 9/2009 | Seo et al. ........................ | 349/55 |
| 2011/0234568 A1* | 9/2011 | Izumida et al. ............... | 345/211 |
| 2011/0254757 A1* | 10/2011 | Kim ................................ | 345/76 |

* cited by examiner

*Primary Examiner* — Paisley L Arendt
(74) *Attorney, Agent, or Firm* — Birch, Stewart, Kolasch & Birch, LLP

(57) ABSTRACT

A display device including a first substrate. The first substrate including an active region and a dummy region formed in an outer edge of the active region, the active region including a plurality of pixel regions and being configured to implement an actual image, the dummy region including a gate in panel (GIP) circuit, control signal lines, a ground, and common lines. The GIP circuit is overlapped by at least a part of the control signal lines, the ground, and the common lines with an insulating layer interposed therebetween. The display device further includes a thin film transistor (TFT) for a shift register is provided in each of a plurality of stages of the GIP circuit; and a source contact hole and a gate contact hole of each TFT for the shift registers, the source contact hole and the gate contact hole being formed along a corresponding control signal line.

20 Claims, 7 Drawing Sheets

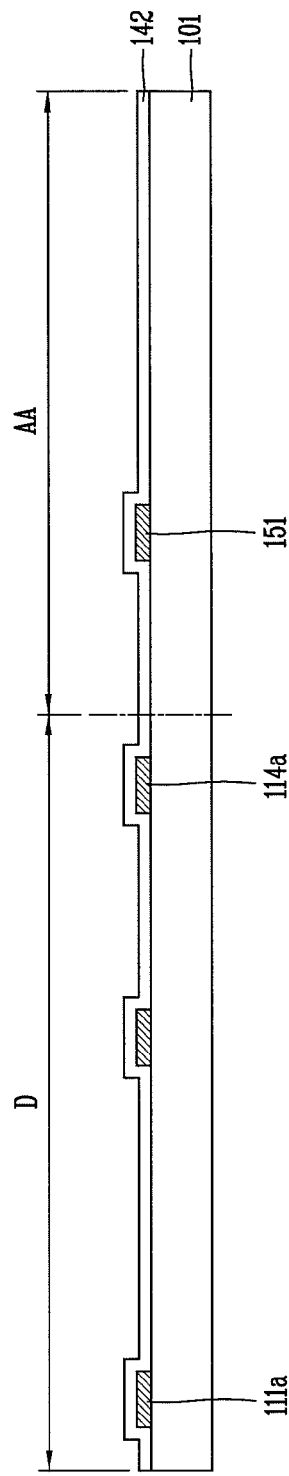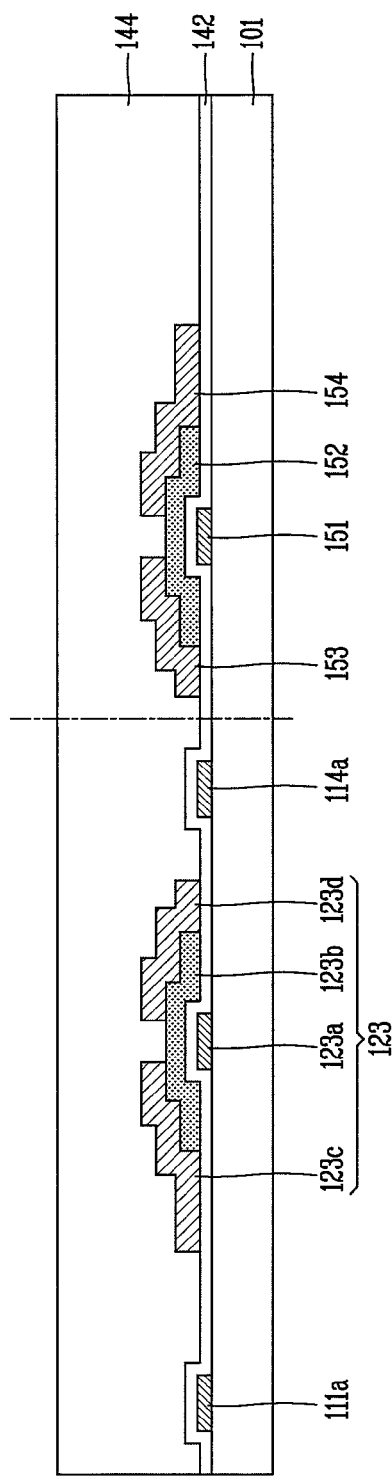

DISPLY DEVICE FOR MINIMIZING THICKNESS OF BEZEL AREA

CROSS-REFERENCE TO RELATED APPLICATION

Pursuant to 35 U.S.C. §119(a), this application claims the benefit of earlier filing date and right of priority to Korean Application No. 10-2013-0167470, filed on Dec. 30, 2013, the contents of which is incorporated by reference herein in its entirety.

BACKGROUND OF THE INVENTION

1. Field of the Invention

The present invention relates to a display device, and particularly, to a display device in which a bezel is minimized by overlapping circuit lines in an outer edge region with an insulating layer interposed therebetween and directly connecting thin film transistors (TFTs) with the circuit lines.

2. Discussion of Background Art

Liquid crystal displays (LCDs) in related art can display an image by adjusting light transmittance of a liquid crystal having dielectric anisotropy using an electric field. An LCD device can include a liquid crystal panel in which pixel regions are arranged in a matrix form and a driving circuit for driving the liquid crystal panel.

The liquid crystal panel includes first and second substrates attached to each other and a liquid crystal layer formed therebetween. A plurality of gate lines and a plurality of data lines can be arranged to cross each other perpendicularly to define pixel regions. A pixel electrode is formed in each pixel region, and a thin film transistor (TFT) is formed at each crossing of a gate line and a data line. A TFT is turned on according to a scan signal of a gate line to apply a data signal of a data line to each pixel electrode to drive the liquid crystal layer.

A black matrix blocking light transmission in a region other than the pixel region and a color filter layer formed in each pixel region to implement an actual color are disposed on the second substrate.

The driving circuit can include a gate driver that drivers the plurality of gate lines, a data driver that drives the plurality of data lines, a timing controller that supplies a control signal for controlling the gate driver and the data driver, a data signal, and the like. The gate driver includes a shift register to sequentially output scan pulses respectively to gate lines.

The shift register includes a plurality of stages dependently connected to each other. The plurality of stages sequentially output the scan pulses to sequentially scan the gate lines of the liquid crystal panel. Among the plurality of stages, a first stage receives a start signal, as a trigger signal, from the timing controller, and the other stages, excluding the first stage, receive an output signal, as a trigger signal, from the first stage (a stage in front of them). Each of the plurality of stages receives at least one clock pulse among a plurality of clock pulses each having a sequential phase difference. Accordingly, scan pulses are sequentially output from the first stage to the final stage.

The gate driver can include a gate driver integrated circuit (IC) in which the shift register is installed. The gate driver IC can be provided and connected to a gate line pad of the liquid crystal panel using a TCP process, for example. The data driver can use a data driver IC and a gate driver can form, via a gate-in-panel (GIP) technique, a shift register on an LCD device to reduce material cost, the number of processes, and a process time.

FIG. 1 is a plan view of a related art LCD device having a GIP structure. The LCD device can have a GIP structure, a first substrate 1, and a second substrate 2. The first substrate 1 and the second substrate 2 are attached together using a sealant 10 with a predetermined space maintained therebetween. Here, the first substrate 1 is formed to be larger than the second substrate 2 to form a non-display region in which a data driver, for example, can be mounted. A display region is formed at an inner side based on the sealant 10, with which the first substrate 1 and the second substrate 2 are attached.

The display region of the attached first and second substrates 1 and 2 is divided into an active region A/A and a dummy region D. A gate line, a data line, a pixel electrode, and a TFT are formed in the active region A/A of the first substrate 1. A black matrix layer and a color filter layer are formed in the active region A/A of the second substrate 2.

The dummy region D of the first substrate 1 can include a GIP gate driver 3, a GIP dummy gate driver 4, a ground 11, control signal lines 12, a GIP circuit 13 configured as a shift register, and a common line 14. The gate driver 3, the GIP dummy gate driver 4, a ground 11, and the control signal lines 12 are for applying various signals such as a clock signal, an enable signal, a start signal, or a common voltage, for example, which are output from a timing controller to the GIP gate driver 3 and the GIP dummy gate driver 4. A black matrix formed to block light transmission to the dummy region D can be formed in the dummy region D of the second substrate 2.

A size of a bezel in related art including a dummy region can be minimized to reduce a size of a display device and obtain a fine appearance, while maintaining a screen with the same size.

FIG. 2 is an enlarged plan view of a region 'A' in FIG. 1. The LCD device having a GIP structure includes the ground 11, the control signal lines 12, the shift GIP circuit 13, and the common line 15 disposed in the dummy region D. The dummy region D needs to have a predetermined width d1 or greater. Thus, a limitation in reducing the area of the dummy region D results in a limitation in reducing the bezel area, making it impossible to manufacture an LCD device having a very small (narrow) bezel area.

A TFT 23 is formed in the shift GIP circuit 13 and a control signal from the control signal lines 12 is input to the TFT 23. The TFT 23 is connected to the signal lines 12 through a metal line 24. Here, to connect the plurality of control signal lines 12 by the metal line 24, the TFT 23 is electrically insulated from the crossing control signal lines 12 by an insulating layer formed on the control signal lines 12. The metal line 24 is formed on the insulating layer, and a contact hole is subsequently formed on a source electrode of the TFT 23 to electrically connect the control signal lines 12 and the TFT 23.

Thus, the related art LCD device having a GIP structure has a complicated structure and processes, increasing manufacturing costs and a probability of generating a defect due to the complicated structure.

SUMMARY OF THE INVENTION

Accordingly, the present invention is directed toward providing a display device in which wirings of a dummy region partially overlap each other with an insulating layer interposed therebetween, thus minimizing a bezel area and simplifying processes.

To achieve these and other advantages and in accordance with the purpose of this specification, as embodied and broadly described herein, a display device can include a first substrate including an active region including a plurality of pixel regions and implementing an actual image and a dummy region formed in an outer edge of the active region; the dummy region including a gate in panel (GIP) circuit, control signal lines, a ground, and common lines. The GIP circuit is overlapped with at least a part of the control signal lines, the ground, and the common lines with an insulating layer interposed therebetween. A thin film transistor (TFT) for a shift register is provided in each of a plurality of stages of the GIP circuit, and a source contact hole and a gate contact hole of each TFT for a shift register are formed along a corresponding control signal line.

The control signal lines can include a clock signal line, an enable signal line, and a start signal line, and the control signal lines can completely overlap the GIP circuit.

The control signal lines can be formed on a passivation layer and electrically connected to a TFT for a shift register of the GIP circuit through a source contact hole. A source contact hole of a TFT for a shift register of the GIP circuit can be spaced apart from a TFT for a shift register of a previous stage by a predetermined gap.

The gate contact hole can be formed in a control signal line corresponding to a source contact hole of a TFT for a shift register of a previous stage.

The display device can be applied to various display devices including, for example, an LCD device, a light emitting display device, an organic light emitting display device, or a plasma display device.

In the present invention, portions of control circuit lines, a ground, and common lines are formed above a GIP circuit with an insulating layer interposed therebetween in a GIP circuit region and overlap the GIP circuit. A region in which lines are formed is reduced, compared to the related art LCD device, reducing a width of a dummy region, resulting in a display device having a very narrow bezel. Because contact holes of a plurality of TFTs for a shift register of a GIP circuit are formed along control circuit lines, an area of a bezel is minimized.

Further scope of applicability of the present application will become more apparent from the detailed description given hereinafter. However, it should be understood that the detailed description and specific examples, while indicating preferred embodiments of the invention, are given by way of illustration only. Various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention. In the drawings:

FIGS. 8A through 8D are views illustrating a method of manufacturing an LCD device according to a fifth embodiment of the present invention.

DETAILED DESCRIPTION OF THE INVENTION

A display device according to an embodiment of the present invention will be described in detail with reference to the accompanying drawings. For the purposes of description, a liquid crystal display (LCD) device will be described as an example of a display device, but the present invention is not limited thereto. The present invention can be applied to various flat display devices, namely, any known and used display devices.

Figure 3:
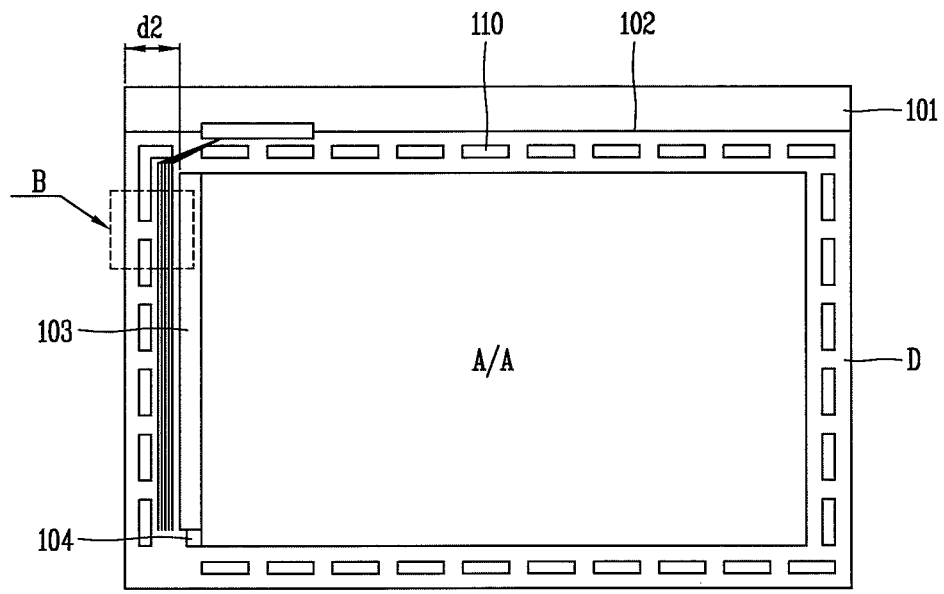
FIG. 3 is a plan view illustrating a structure of an LCD device according to a first embodiment of the present invention.

FIG. 3 is a plan view illustrating a structure of an LCD device according to a first embodiment of the present invention. The LCD device having a gate-in-panel (GIP) structure according to the first embodiment of the present invention can include a first substrate 101 and a second substrate 102 formed of a transparent material such as glass or plastic and attached by a sealant 110. The first substrate 101 can be larger than the second substrate 102 to form a non-display region in which a data driver, for example, is mounted. A display region is formed at an inner side, based on the sealant 110, of the first substrate 101 and the second substrate 102 attached by the sealant 110.

The display region of the attached first and second substrates 101 and 102 is divided into an active region A/A and a dummy region D. The active region A/A is a region in which an image is actually implemented. The active region A/A can include a plurality of pixel regions defined by a plurality of gate lines and a plurality of data lines disposed on the first substrate 101, thin film transistors (TFTs), and switching elements, respectively formed in pixel regions and driven according to a signal applied thereto to apply an image signal to an image region. The active region A/A can include a pixel electrode and a common electrode formed in the pixel region to implement an image by controlling transmittance of light being transmitted through a liquid crystal layer by driving liquid crystal molecules of the liquid crystal layer when an image signal is supplied according to an operation of the TFT's. The active region A/A can include a black matrix formed on the second substrate to block light transmission to a region other than a region in which an image is implemented. The active region A/A can include a color filter layer including R, G, and B color filters and implementing an actual color.

In the first embodiment of the present invention, an LCD device is illustrated as an example of a display device, but the present invention is not limited thereto and can also be applied to, for example, a field emission display device, an organic light emitting display device, an electrophoretic display device, or a plasma display device.

Thus, when the present invention is applied to an electroluminescent display or an organic light emitting display device, a light emitting unit or an organic light emitting unit, rather than a liquid crystal layer, is formed between a pixel electrode and a common electrode in an active region A/A. When the present invention is applied to an electrophoretic display device, an electrophoretic layer, rather than a liquid crystal layer, can be formed between a pixel electrode and a common electrode in an active region A/A. When the present invention is applied to a plasma display device, a plasma layer, rather than a liquid crystal layer, can be formed between a pixel electrode and a common electrode in an active region A/A.

A GIP gate driver 103, a GIP dummy gate driver, a ground 111, control signal lines 112 for applying various signals. The various signals include, for example, a clock signal, an enable signal, a start signal, a common voltage, output from a timing controller to the GIP gate driver 103 and the GIP dummy gate driver 104. A GIP circuit 113 configured as a shift register, and a common line 114 are formed in the dummy region D of the first substrate 101. A black matrix can be formed in the dummy region D of the second substrate 102 to block light transmission to a region other than a region in which an image is implemented. The control signal lines 112 include, for example, a clock signal line, an enable signal line, and a start signal line.

Figure 4A:
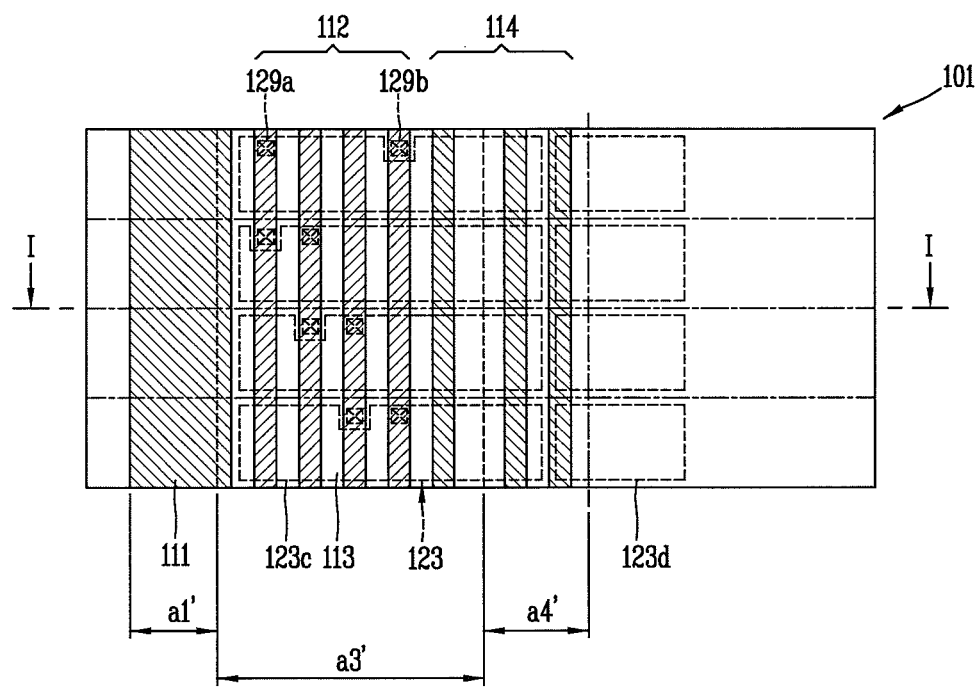
FIG. 4A is an enlarged plan view of region 'B' in FIG. 3.
Figure 4B:
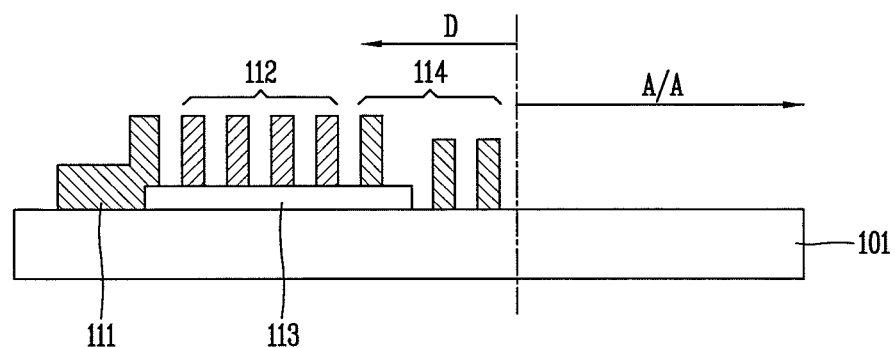
FIG. 4B is a schematic cross-sectional view of the region 'B' in FIG. 3.

FIGS. 4A and 4B are enlarged views of region B of FIG. 3. FIG. 4A is a plan view illustrating a layout of lines in a plurality of stages of the dummy region D, and FIG. 4B is a cross-sectional view schematically illustrating a layer structure. In the LCD device having a GIP structure, a plurality of TFTs is formed in the dummy region. Hereinafter, a shape and a connection structure of pull-up transistors, among the plurality of TFTs, will be described.

In the dummy region D, the common lines 115, the GIP circuit 113, the control signal lines 112, and the ground 111 are sequentially disposed, from the boundary of the active region A/A (refer to FIG. 4A). Common lines 114 and control signal lines 112, as illustrated in FIGS. 4A and 4B of the present invention, are merely illustrative and not limited to a particular number. The number of lines can be determined according to, for example, a size of a manufactured liquid crystal panel, the number of pixels, or the number of GIP gate drivers 103 mounted on the liquid crystal panel.

The GIP circuit 113 is disposed on the first substrate 101 (refer to FIGS. 4A and 4B). The ground 111 and the common lines 114 are disposed on both sides of the GIP circuit, and the control signal lines 112 are disposed on the GIP circuit 112. Here, the control signal lines 112 are formed on the GIP circuit 113 in a fully overlapping manner, and the ground 111 and the common lines 111 are formed on the first substrate 101 and the GIP circuit in a partially overlapping manner. Namely, portions of the ground 111 and the common lines 114 are formed on the first substrate 101 and portions of the ground 111 and the common lines 114 are formed on the GIP circuit 113. Here, only a portion of the control signal lines 112 can also overlap with the GIP circuit 113. Because the control signal lines 112 are formed on the GIP circuit 113 and portions of the ground 111 and the common lines 114 are formed on the GIP circuit 113, a width of the dummy region can be reduced, relative to the related art LCD device.

Figure 1:
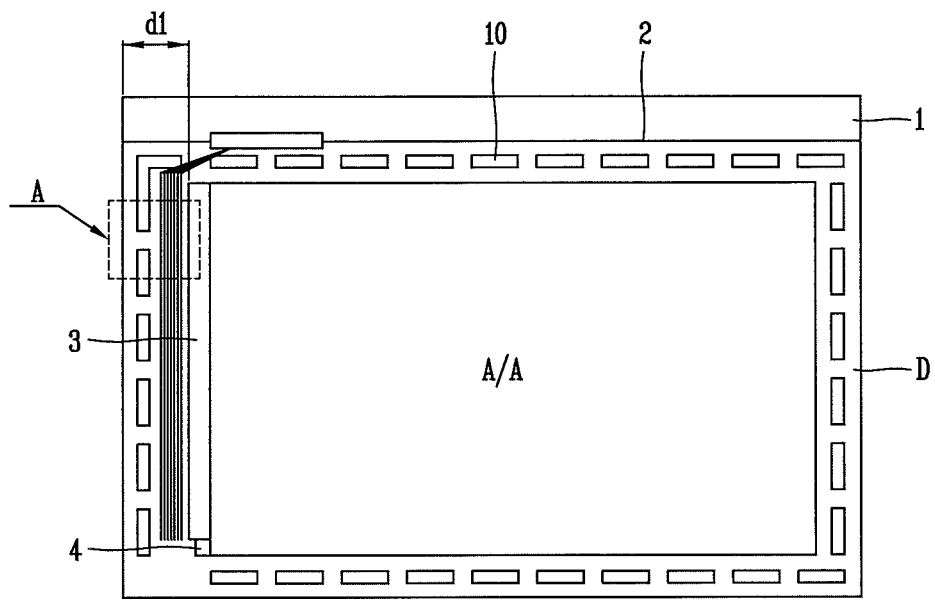
FIG. 1 is a plan view illustrating a structure of a related art liquid crystal display (LCD) device.
Figure 2:
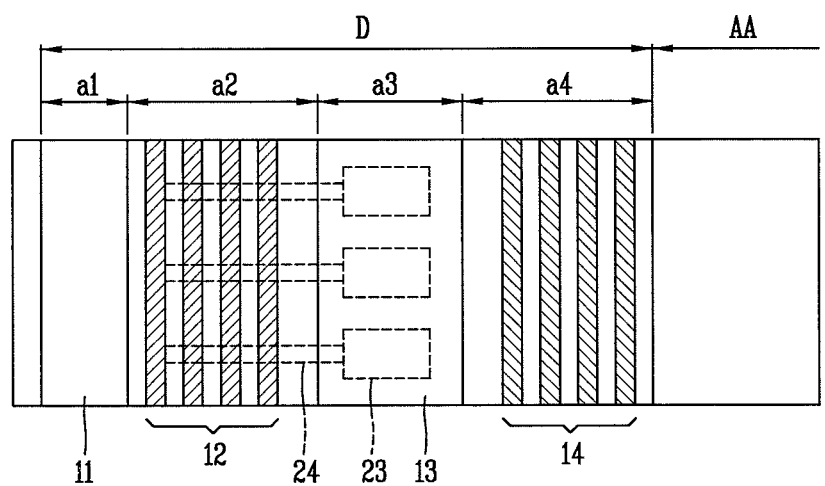
FIG. 2 is an enlarged plan view of region 'A' in FIG. 1.

The related art LCD device includes the ground 11, the GIP circuit 13, the control signal lines 12, and the common lines 14 having widths a1, a2, a3, and a4, respectively, which are disposed on the first substrate 1 (refer to FIG. 2). However, in the LCD device according to the first embodiment of the present invention, the ground 111, the GIP circuit 113, and the common lines 114 having widths a1', a3', and a4', respectively, are formed on the first substrate 101 (refer to FIG. 4A).

Because the control signal lines 114 are formed on the GIP circuit 113, the control signal lines 112 do not occupy any region of the first substrate 101. Also, because the ground 111 partially overlaps with the GIP circuit 113, the width a1' is smaller than the width a1 (a1'<a1), and because the common lines 114 partially overlap with the GIP circuit 113, the width a4' is smaller than the width a4 (a4'<a4). In this case, the ground 111 overlaps 50% to 100% of the entire area of the GIP circuit 113, and the common lines 114 overlap 50% to 100% of the entire area of the GIP circuit 113. As a result, in the first embodiment of the present invention, a width of the dummy region D corresponding to a3+(a1−a1')+(a4−a4') can be reduced (namely, d1>d2).

The GIP circuit 113, according to the first embodiment, includes a plurality of thin film transistors 123 (refer to FIG. 4A). Here, because the control signal lines 112 are formed on the GIP circuit 113, the control signal lines 112 are formed on the TFTs 123 of the GIP circuit 113. Thus, although the related art LCD device includes control signal lines connected to the TFTs by a metal line, the LCD device in the first embodiment of the present invention includes the control signal lines directly connected to the TFTs through a contact hole.

Each of the TFTs 123 can include, according to the first embodiment, a gate electrode, a semiconductor layer, a source electrode 123c, and a drain electrode 123d (refer to FIG. 4A). The source electrode 123c is formed to widen from one side of the GIP circuit to the other end and the drain electrode 123d is formed to face the source electrode 123c. Source contact holes 129a are formed on source electrodes 123c of the plurality of TFTs 123, respectively. A gate contact hole 129b is formed on a gate electrode.

Because signals are input to source electrodes 123c from control signal lines 112, respectively, the source contact holes 129a are formed along the control signal lines 112. The control signal lines 112 are disposed at predetermined intervals, and thus, the source contact holes 129a of the plurality of TFTs are also formed at predetermined intervals in an x direction along the control signal lines 112. In other words, regions in which the source electrodes 123c are formed in each stage are the same, but positions of the source contact holes 129a differ according to the control signal lines 112.

The gate contact holes 129b are also formed along the control signal lines 112. The TFT according to the first embodiment is a pull-up transistor and receives a source input signal of a front stage, as a gate signal. Thus, the gate contact holes 129b are formed along the control signal lines 112 corresponding to the source contact holes 129a of a front stage. Here, to prevent the source electrodes 123a and the gate electrodes from being short-circuited, a region of each source electrode in which the gate contact hole 129b is formed is removed and an insulating layer is exposed thereto. Thus, because the control signal lines 112 and the GIP circuit 113 overlap with each other, shapes of the TFTs of the GIP circuit 113 (i.e., shapes of contact holes and source electrodes) differ according to each stage.

Figure 5:
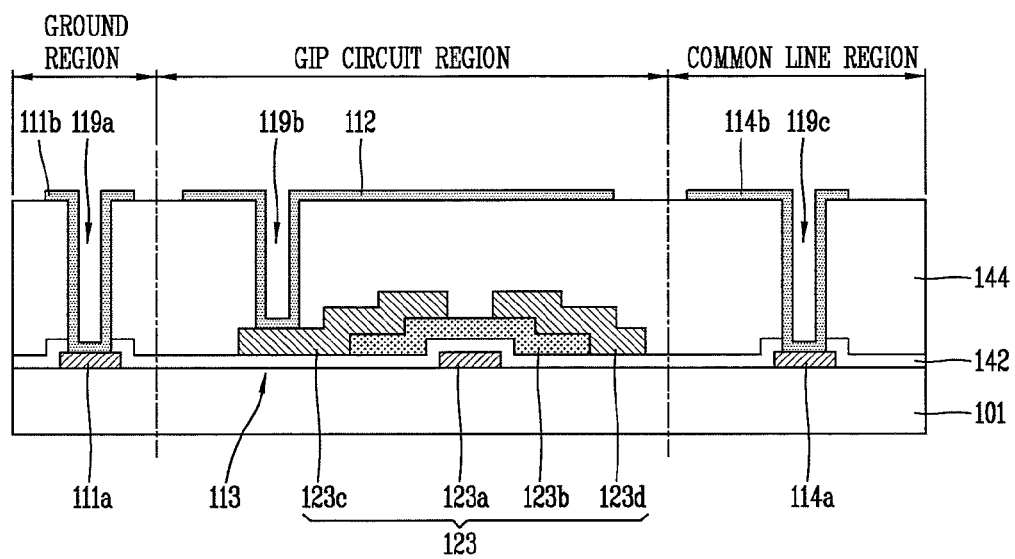
FIG. 5 is a cross-sectional specifically illustrating a structure of an LCD device according to a second embodiment of the present invention.

Next, FIG. 5 is a view illustrating only a dummy region of an LCD device according to a second embodiment of the present invention. A dummy region D of the first substrate 101 includes a ground region, a GIP circuit region, and a common line region. In the ground region, the GIP circuit region, and the common line region of the first substrate 101, a first ground 111a, a gate electrode 123a of a TFT 123 for a shift register forming the GIP circuit 113, and a first common line 114a are formed, respectively.

The first ground 111a, the gate electrode 123a of the TFT 123 for a shift register, and the first common line 114a can be formed of different metals through different processes or may be formed of the same metal through the same process. Here, the first ground 111a, the gate electrode 123a of the TFT 123 for a shift register, and the first common line 114a may be formed as a single layer formed of a metal having good conductivity such as aluminum (Al) or an Al alloy. Also, the first ground 111a, the gate electrode 123a of the TFT 123 for a shift register, and the first common line 114a can be formed as a plurality of layers such as AlNd/Mo.

A gate insulating layer 142 formed of an inorganic insulating material such as SiOx or SiNx is formed on the first substrate 101 with the first ground 111a, the gate electrode 123a of the TFT 123 for a shift register, and the first common line 114a formed thereon. A semiconductor layer 123b is formed on the gate insulating layer 142 of the GIP circuit region. As a material of the semiconductor layer 123b, amorphous silicon a-Si is mainly used, but crystalline silicon or an oxide semiconductor can also be used. A source electrode 123c and a drain electrode 123d are formed on the semiconductor layer 123b, completing the TFT 123 for a shift register. Here, the source electrode 123c and the drain electrode 123d can be formed of a metal having good conductivity including, for example, Al, an Al alloy, or an Mo. Lines as well as the TFT for a shift register, can be formed in the GIP circuit region.

A passivation layer 144 is formed on the first substrate 101 with the TFT for a shift register formed thereon. The passivation layer 144 may be formed of an organic material such as photoacryl or an inorganic material such as SiOx or SiNx. Alternatively, the passivation layer 144 can be formed as a dual-layer including an inorganic passivation layer and an organic passivation layer.

A first contact hole 119a, a second contact hole 119b, and a third contact hole 119c are formed in the ground region, the GIP circuit region, and the common line region. Here, the second contact hole 119b is formed only in the passivation layer 144, allowing the TFT 123 to be exposed therethrough, and the first contact hole 119a and the third contact hole 119c are formed in the gate insulating layer 142 and the passivation layer 144, allowing the first ground 111a and the first common line 114 to be exposed therethrough, respectively.

A second ground 111b is formed on the passivation layer 144 in the ground region, a control circuit line 112 is formed on the passivation layer 144 in the GIP circuit region, and a second common line 114b is formed on the passivation layer 144 in the common line region, respectively. The second ground 111b is electrically connected to the first ground 111a through the first contact hole 119a, the control circuit line 112 is directly electrically connected to the source electrode 123c of the TFT 123 for a shift register, namely, the GIP circuit, through the second contact hole 119b, and the second common line 114b is electrically connected to the first common line 119a through the third contact hole 119c.

As shown in figure, in this embodiment the control circuit line 112 is directly connected to the drain electrode 123d of the TFT 123 for a shift register through the second contact hole 119b. However, in this embodiment, an additional metal line can be formed to the control circuit line 112 to the drain electrode 123d of the TFT for a shift register. Here, a metal oxide such as a indium tin oxide (ITO) or indium zinc oxide (IZO), or an opaque metal can be used as the additional metal line. When the additional metal line is used, since the metal line does not overlap with the control circuit lines 112, it is not necessary to from an additional insulating layer to insulate the additional metal line from the control circuit lines 112 and an additional contact hole formed in the additional insulating layer.

A portion of the second ground 111b and a portion of the second common line 114b can extend to the GIP circuit region. Thus, because the portion of the second ground 111b and the portion of the second common line 114b, as well as the control circuit line 112, are formed in the GIP circuit region, the GIP circuit (e.g., a shift register) can overlap portions of the control circuit line 112, the second group 111b, and the second common line 114b with the insulating layer (e.g., gate insulating layer 142) and/or the passivation layer 144 interposed therebetween.

In this manner, in the second embodiment of the present invention, because the portions of the control circuit line 112, the second ground 111b and the second common line 114b are formed above the GIP circuit with the insulating layer interposed in the GIP circuit region, a width of the dummy region can be reduced, compared to the related art LCD device. Portions of the second ground 111b and the second common line 114b overlap with the GIP circuit, but alternatively, only the control circuit line 112 can be formed to overlap with the GIP circuit, while the second ground 111b and the second common line 114b do not overlap with the GIP circuit, or a portion of only one of the second ground 111b and the second common line 114b can overlap with the GIP circuit. In other words, in the second embodiment of the present invention, the entirety or portions of the control circuit line 112, the second ground 111b, and the second common line 114b can overlap with the GIP circuit with the insulating layer interposed therebetween.

Figure 6:
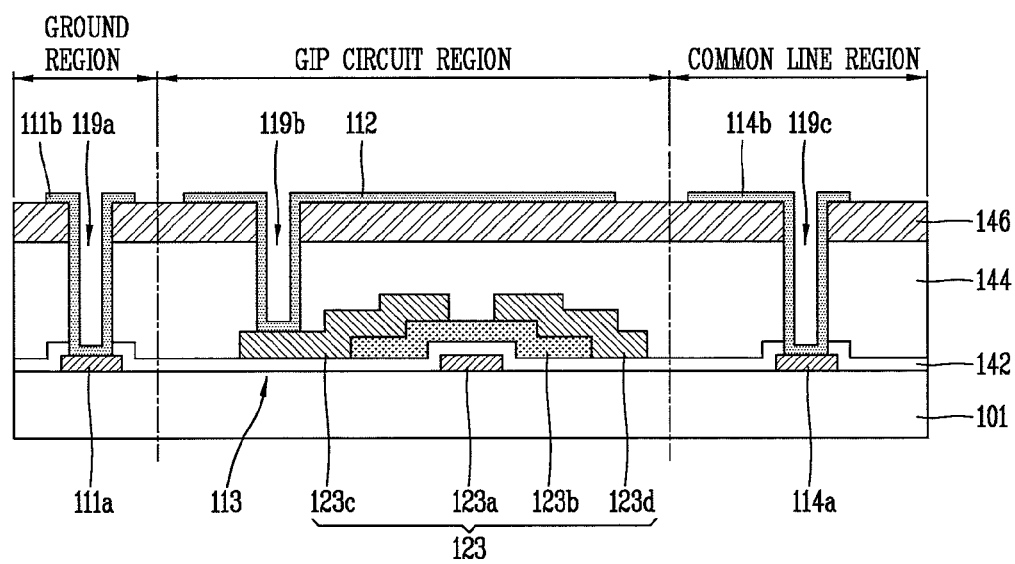
FIG. 6 is a cross-sectional specifically illustrating a structure of an LCD device according to a third embodiment of the present invention.

Next, FIG. 6 is a cross-sectional specifically illustrating a structure of an LCD device according to a third embodiment of the present invention. A dummy region D of the first substrate 101 includes a ground region, a GIP circuit region, and a common line region. In the ground region and the common line region of the first substrate 101, a first ground 111a and a first common line 114a are formed respectively. In the GIP circuit region, a GIP circuit 113 including a TFT control circuit line 123 for a plurality of shift registers having a gate electrode 123a, a semiconductor layer 123b, a source electrode 123c, and a drain electrode 124 is formed. A gate insulating layer 142 is formed on the first ground 111a, the first common line 114a, and the gate electrode 123a of the TFT 123 for a shift register. A passivation layer 144 formed of an inorganic layer or an organic layer, or an organic layer/inorganic layer, is formed on the first substrate 101 with the TFT for a shift register formed thereon. A color filter layer 146 is formed on the passivation layer 144.

Namely, the LCD device according to the third embodiment of the present invention is an LCD device having a color filter on TFT (COT) structure in which the color filter layer 146 is formed on the first substrate 101. In comparison to the LCD device as illustrated in FIG. 4 in which a color filter layer is formed on a second substrate (e.g., on an upper substrate), the LCD device according to the third embodiment includes the color filter layer 146 formed on the first substrate 101.

Because R, G, B color filters are directly formed on the pixels in the LCD device having the COT structure, there is no need to consider a defect or an attachment margin due to misalignment of the first and second substrates that can occur when a color filter layer is formed on the second substrate.

The color filter layer 146 can be a single layer among an R-color filter layer, a G-color filter layer, and a B-color filter layer, three layers including R-color filter layer, a G-color filter layer, and a B-color filter layer, or two layers having different colors. A first contact hole 119a, a second contact hole 119b, and a third contact hole 119c are formed in the ground region, the GIP circuit region, and the common line region, respectively. Here, the second contact hole 119b is formed only in the passivation layer 144 and the color filter layer 146, allowing the TFT 123 for a shift register to be exposed therethrough, and the first contact hole 119a and the third contact hole 119c are formed in the gate insulating layer 142, the passivation layer 144, and the color filter layer, allowing the first ground 111a and the first common line 114a to be exposed therethrough, respectively. A second ground 111b is formed on the color filter layer 146 in the ground region, a control circuit line 112 is formed on the color filter layer 146 in the GIP circuit region, a second common line 114b is formed on the color filter layer 146 in the common line region, respectively. The second ground 111b is electrically connected to the first ground 111a through the first contact hole 119a, and the control circuit line 112 is directly electrically connected to the drain electrode 123d of the TFT 123 for a shift register (e.g., the GIP circuit), through the second contact hole 119b, and the second common line 114b is electrically connected to the first common line 119a through the third contact hole 119c.

A buffer layer can be formed of an inorganic insulating material or an organic insulating material and formed on the color filter layer 146. The buffer layer serves to enhance interface characteristics with respect to the color filter layer 146 when the control circuit line 112, the second ground 111b, and the second common line 114b are formed. Also, the first contact hole 119a, the second contact hole 119b, and the third contact hole 119c can be formed also in the buffer layer. A black matrix can be formed in the dummy region of the second substrate to block light transmission thereto, preventing a degradation of image quality.

Figure 7:
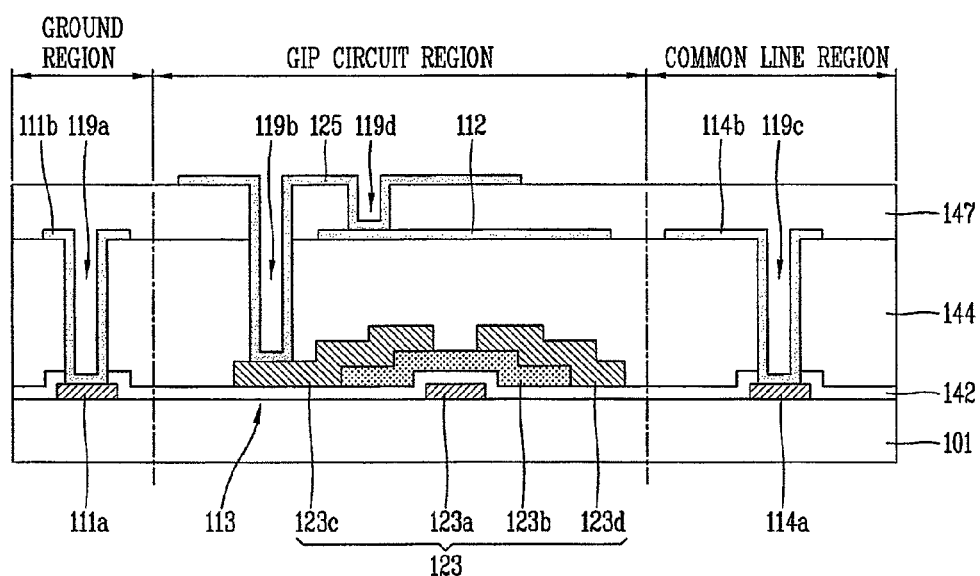
FIG. 7 is a cross-sectional specifically illustrating a structure of an LCD device according to a fourth embodiment of the present invention.

Next, FIG. 7 is a cross-sectional specifically illustrating a structure of an LCD device according to a fourth embodiment of the present invention. A dummy region D of the first substrate 101 includes a ground region, a GIP circuit region, and a common line region. In the ground region and the common line region of the first substrate 101, a first ground 111a and a first common line 114a are formed, respectively. In the GIP circuit region, a GIP circuit 113 including a TFT control circuit line 123 for a plurality of shift registers having a gate electrode 123a, a semiconductor layer 123b, a source electrode 123c, and a drain electrode 124 is formed. A gate insulating layer 142 is formed on the first ground 111a, the first common line 114a, and the gate electrode 123a of the TFT 123 for a shift register.

A passivation layer 144 formed of an inorganic layer or an organic layer, or an organic layer/inorganic layer, is formed on the first substrate 101 with the TFT for a shift register formed thereon. A first contact hole 119a and a third contact hole 119c are formed in the gate insulating layer 142 and the passivation layer 144 of the ground region and the common line region, respectively, and the first ground 111a and the first common line 114a are exposed through the first contact hole 119a and the third contact hole 119c. A second ground 111b is formed on the passivation layer 144 in the ground region, a control circuit line 112 is formed on the passivation layer 144 in the GIP circuit region, and a second common line 114b is formed on the passivation layer 144 in the common line region, respectively. The second ground 111b is electrically connected to the first ground 111a through the first contact hole 119a, and the second common line 114b is electrically connected to the first common line 119a through the third contact hole 119c.

An interlayer insulating layer 147 is formed on the passivation layer 144. The interlayer insulating layer 147 can be formed of an organic insulating material or an inorganic insulating material. A second contact hole 119b and a fourth contact hole 119d are formed in the GIP circuit region. Here, the second contact hole 119b can be formed in the interlayer insulating layer 147 and the passivation layer 144, allowing the TFT 123 for a shift register to be exposed therethrough, and the fourth contact hole 119d is formed in the interlayer insulating layer 147, allowing the control circuit line 112 to be exposed therethrough.

A connection line 125 is formed on the interlayer insulating layer 147. The connection line 125 is also formed on the second contact hole 119b and the fourth contact hole 119d so as to be connected to the control circuit line 112 and the TFT 123 for a shift register respectively exposed through the second contact hole 119b and the fourth contact hole 119d, electrically connecting the control circuit line 112 and the TFT 123 for a shift register. The connection line 125 can be formed of a metal oxide such as transparent ITO or IZO, or can be formed of an opaque metal. A color filter layer can be formed on the interlayer insulating layer 147, forming an LCD device having a CT structure.

In the fourth embodiment of the present invention, the connection line 125 is formed to electrically connect the control circuit line 112 and the TFT for a shift register. However, because the connection line 125 does not cross any other line, a defect due to a short circuit of two lines can be prevented. Also, in the fourth embodiment the TFTs 123 can be formed to be spaced apart from one another by a predetermined distance in the x and y directions along the control circuit line 112 (refer to FIG. 4A). Thus, since the TFTs 123 are not disposed to be adjacent to each other, a space between the TFTs can be minimized without causing an electrical defect.

Next, FIGS. 8A through 8D are views illustrating a method of manufacturing an LCD device according to a fifth embodiment of the present invention. The method is for manufacturing the LCD device having the structure illustrated in FIG. 5, but the LCD devices having the structures illustrated in FIGS. 6 and 7 can also be manufactured through the same method. Also, the method for manufacturing the LCD device is for the LCD device having a particular pixel structure, but the present invention is not limited thereto and can be applied to various types of LCD devices including, for example, an in-plane switching (IPS) mode LCD device, a twisted nematic (TN) mode LCD device, or a vertical alignment (VA) mode LCD device. Also, the method for manufacturing the LCD device is for the LCD device including various electrodes or insulating layers, as described below, but the present invention is not limited thereto. The present invention can be applied to LCD devices having any structure that includes lines of a dummy region formed in an overlapping manner.

As illustrated in FIG. 8A, AlNd and Mo are continuously stacked on the entirety of a first substrate 101 formed of transparent glass or plastic and including a dummy region D and an active region A/A through sputtering and etched through photolithography to form a first ground 111a, a gate electrode 123a of a TFT for a shift register, and a second common line 112 in the dummy region D and a gate electrode 151 of a switching TFT of a pixel in an active region A/A. Subsequently, an inorganic insulating material such as SiOx or SiNx is stacked on the entire surface of the first substrate 101 through chemical vapor deposition (CVD) to form a gate insulating layer 142.

Subsequently, as illustrated in FIG. 8B, an amorphous semiconductor material such as amorphous silicon is stacked on the first substrate 101 and etched to form a semiconductor layer 123b of a TFT for a shift register on the gate insulating layer 142 above the gate electrode 123a for a shift register and a semiconductor layer 152 of the switching TFT on the gate insulating layer 142 above the gate electrode 151 of the switching TFT of a pixel.

Thereafter, a metal such as Mo is stacked through sputtering and etched through photolithography to form a source electrode 123c and a drain electrode 123d of the TFT for a shift register and a source electrode 153 and a drain electrode 154 of the switching TFT to thus form a GIP circuit line including a shift register in the dummy region D and the switching TFT in each pixel region of the active region A/A, respectively.

Subsequently, an organic material such as photoacryl or an inorganic material such as SiOx or SiNx is stacked on the first substrate 101 with the TFT formed thereon to form a passivation layer 144. Here, the passivation layer 144 can be formed as a dual-layer by continuously stacking an inorganic material and an organic material.

Figure 8C:
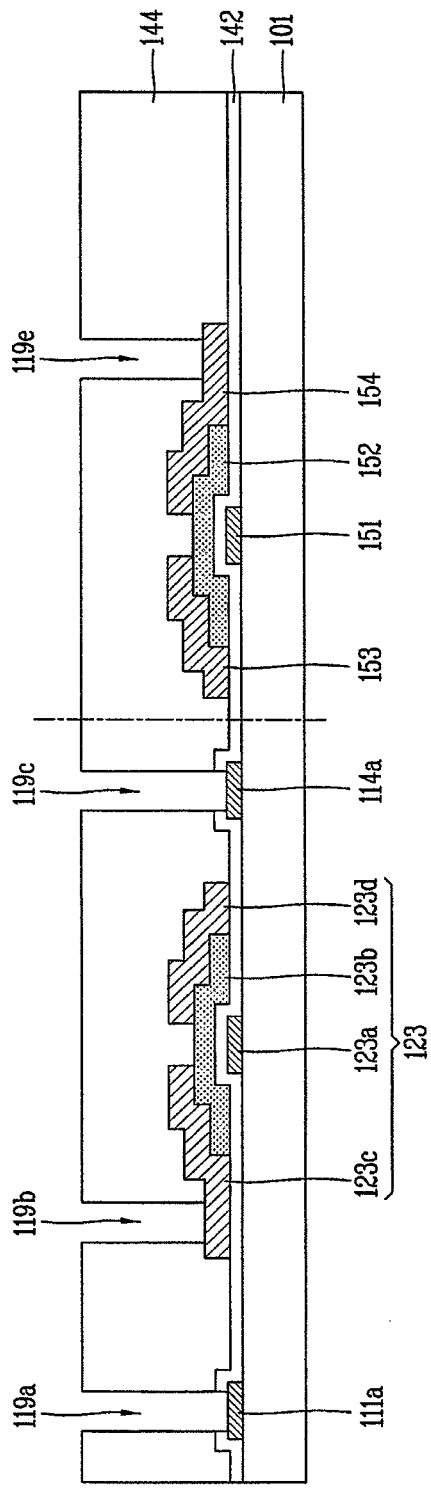

Thereafter, as illustrated in FIG. 8C, portions of the passivation layer 144 are etched to form a first contact hole 119a, a second contact hole 119b, and a third contact hole 119c in the dummy region D to expose the first ground 111a, the source electrode 123c of the TFT for a shift register, and the first common line 114a, respectively, and form a fourth contact hole 119e in the active region A/A to expose the drain electrode 154 of the switching TFT.

Figure 8D:
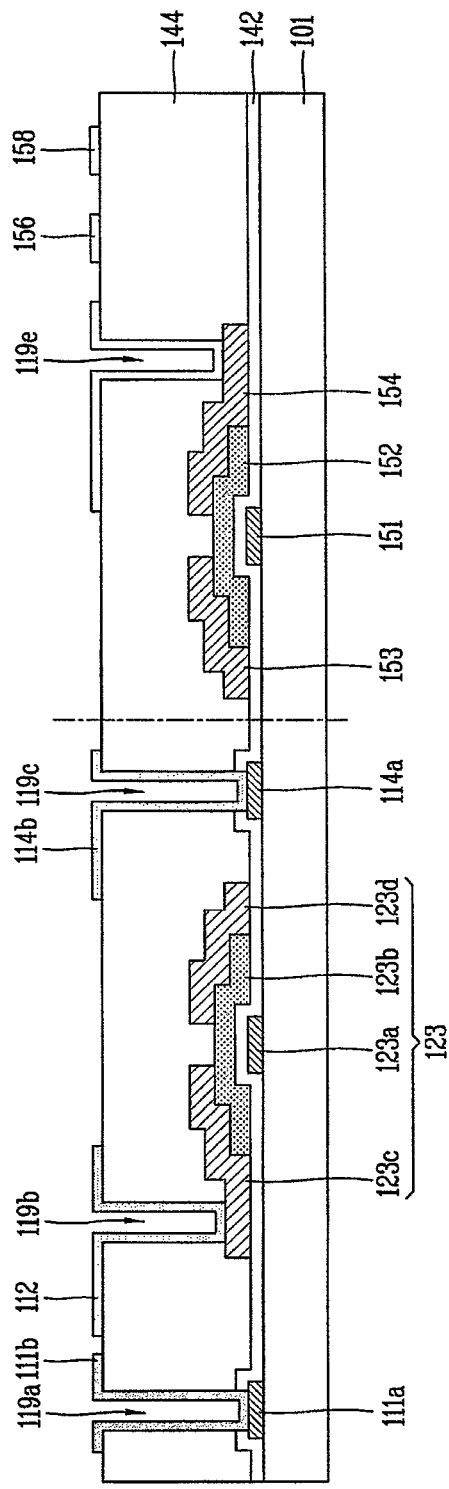

Subsequently, as illustrated in FIG. 8D, a transparent conductive material such as ITO is stacked on the passivation layer 144 and etched to form at least a pair of common electrode 156 and a pixel electrode 158 in the active region A/A. Here, the common electrode 156 and the pixel electrode 158 have a band shape with a predetermined width and are arranged in parallel, and the pixel electrode 158 is electrically connected to the drain electrode 154 of the switching TFT through the fourth contact hole 119e and an image signal is applied from the outside through the switching TFT.

Subsequently, Mo, Al, and Mo are continuously stacked on the passivation layer 144 and etched to form a second ground 111b, a control signal line 112, and a second common line 114b in the dummy region D. The second ground 111b is electrically connected to the first ground 111a through the first contact hole 119a, the control signal line 112 is connected to the GIP circuit (e.g., the source electrode 123c for a shift register) through the second contact hole 119b, and the second common line 114b is electrically connected to the first common line 114a through the third contact hole 119c.

Here, the second ground 111b, the control signal line 112, and the second common line 114b a can be formed as the same metal layer (e.g., Mo/Al/Mo through the same process, or formed of different metals through different processes. The second ground 111b formed on the passivation layer 144 can partially overlap the GIP circuit or not partially overlap the GIP circuit. Also, the second common line 114b can partially overlap the GIP circuit or not partially overlap the GIP circuit. Thereafter, a color filter layer and a black matrix can be formed on a second substrate, the first and second substrates can be attached by a sealant, and a liquid crystal layer can be formed between the first and second substrates, completing an LCD device.

As described above, in the present invention, some lines formed in the dummy region overlap with other lines with an insulating layer interposed therebetween, minimizing an area of the dummy region, and as a result, an area of a bezel area of an LCD device can be minimized, reducing a size of the LCD device and obtain a fine appearance. Also, because the TFTs for a shift register are disposed in a crisscross manner along the control signal lines, the TFTs for a shift register are not formed to be adjacent in the same line, minimizing an area in which the TFTs for a shift register and further reducing an area of the bezel. Although the LCD device having a particular structure has been described, this is only for the purpose of description and the present invention is not limited thereto.

The present invention can be applied to any type of LCD device including portions of various lines that overlap each other with an insulating layer interposed therebetween to reduce an area of a dummy region. In addition, the present invention is not limited only to an LCD device but can be applied to various display devices such as, for example, an electroluminescent display device, an organic light emitting display device, an electrophoretic display device, or a plasma display device.

The foregoing embodiments and advantages are merely exemplary and are not to be considered as limiting the present invention. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein can be combined in various ways to obtain additional and/or alternative exemplary embodiments.

As the present features can be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A display device comprising:
   a first substrate including an active region and a dummy region formed in an outer edge of the active region, the active region including a plurality of pixel regions and being configured to implement an actual image, the dummy region including a gate in panel (GIP) circuit, control signal lines, a ground, and common lines, wherein the GIP circuit is overlapped by at least a part of the control signal lines, the ground, and the common lines with an insulating layer interposed therebetween;
   a thin film transistor (TFT) for a shift register provided in each of a plurality of stages of the GIP circuit, each TFT for the shift registers including a source electrode configured to receive a signal along the control signal lines; and
   a source contact hole and a gate contact hole of each TFT for the shift registers,
   wherein each source contact hole of a corresponding TFT for a shift register provided in a previous stage of the GIP circuit and each gate contact hole of a corresponding TFT for a shift register provided in an adjacent stage of the GIP circuit are formed along a corresponding control signal line.

2. The display device of claim 1, further comprising:
   a plurality of gate lines and a plurality of data lines formed in the active region to define the plurality of pixel regions;
   a switching TFT formed in each of the pixel regions; and
   a passivation layer formed on the first substrate with the TFTs for the shift registers formed thereon.

3. The display device of claim 2, wherein each switching TFT includes:
   a gate electrode formed on the first substrate;
   a gate insulating layer formed on the first substrate and covering the gate electrode;
   a semiconductor layer formed on the gate insulating layer; and
   a source electrode and a drain electrode formed on the semiconductor layer.

4. The display device of claim 3, wherein the control signal lines are formed on the passivation layer.

5. The display device of claim 4, wherein a source contact hole of a TFT for the shift register of a particular stage of the GIP circuit is spaced apart from a TFT for the shift register of a previous stage by a predetermined gap.

6. The display device of claim 3, wherein the ground includes:
   a first ground formed on the first substrate; and
   a second ground formed on the passivation layer and electrically connected to the first ground through a contact hole.

7. The display device of claim 3, wherein the common lines include:
   a first common line formed on the first substrate; and
   a second common line formed on the passivation layer and electrically connected to the first common line through a second contact hole.

8. The display device of claim 2, further comprising:
   a color filter layer formed on the passivation layer.

9. The display device of claim 8, wherein the control signal lines, a second ground, and second common lines are formed on the color filter layer.

10. The display device of claim 2, wherein the passivation layer is formed of photoacryl.

11. The display device of claim 2, wherein the passivation layer is formed of an inorganic insulating material.

12. The display device of claim 2, wherein the passivation layer includes:
    an inorganic passivation layer; and
    an organic passivation layer formed on the inorganic passivation layer.

13. The display device of claim 2, further comprising:
    an interlayer insulating layer formed on the passivation layer;
    a third contact hole formed in the passivation layer and the interlayer insulating layer;
    a fourth contact hole formed on the interlayer insulating layer; and
    a connection line formed on the interlayer insulating layer and electrically connecting the control signal lines and the corresponding TFTs for the shift register through the third and fourth contact holes, respectively.

14. The display device of claim 1, wherein each TFT for the shift registers includes:
    a gate electrode exposed by the gate contact hole and configured to receive a gate signal through the gate contact hole;
    a semiconductor layer formed on the gate electrode; and
    a drain electrode formed on the semiconductor layer.

15. The display device of claim 14, wherein a source electrode in a region where the gate contact hole is formed in each TFT for the shift registers is removed.

16. The display device of claim 1, wherein the control signal lines include a clock signal line, an enable signal line, and a start signal line.

17. The display device of claim 1, wherein the control signal lines completely overlap the GIP circuit.

18. The display device of claim 1, further comprising:
    a second substrate attached to the first substrate;
    a black matrix formed on the second substrate; and
    a liquid crystal layer formed between the first and second substrates.

19. The display device of claim 1, further comprising:
    a second substrate attached to the first substrate; and
    a light emitting unit or an organic light emitting unit formed between the first and second substrates.

20. The display device of claim 1, further comprising:
    a second substrate attached to the first substrate; and
    an electrophoretic layer formed between the first and second substrates.

* * * * *